(12) United States Patent
Yamashita

(10) Patent No.: US 11,605,653 B2
(45) Date of Patent: Mar. 14, 2023

(54) SEMICONDUCTOR DEVICE AND DISPLAY DEVICE

(71) Applicant: Japan Display Inc., Tokyo (JP)

(72) Inventor: Manabu Yamashita, Tokyo (JP)

(73) Assignee: Japan Display Inc., Tokyo (JP)

( * ) Notice: Subject to any disclaimer, the term of this patent is extended or adjusted under 35 U.S.C. 154(b) by 79 days.

(21) Appl. No.: 17/189,404

(22) Filed: Mar. 2, 2021

(65) Prior Publication Data

US 2021/0280610 A1    Sep. 9, 2021

(30) Foreign Application Priority Data

Mar. 5, 2020   (JP) .............................. JP2020-037740

(51) Int. Cl.
*H01L 27/14* (2006.01)
*H01L 27/12* (2006.01)
*H01L 27/32* (2006.01)

(52) U.S. Cl.
CPC ........ *H01L 27/124* (2013.01); *H01L 27/3276* (2013.01)

(58) Field of Classification Search
CPC .............. H01L 27/124; H01L 27/3276; H01L 27/1225; H01L 29/66969; H01L 29/7869
USPC ..................................................... 257/59, 72
See application file for complete search history.

(56) References Cited

U.S. PATENT DOCUMENTS 10,692,442 B2 *  6/2020  Lee ..................... H01L 51/5203
11,011,599 B2 *  5/2021  Kim .................... H01L 27/3293
2013/0299819 A1  11/2013  Yamazaki et al.

FOREIGN PATENT DOCUMENTS

CN          110444567 A  *  11/2019

* cited by examiner

*Primary Examiner* — Tan N Tran
(74) *Attorney, Agent, or Firm* — Maier & Maier, PLLC

(57) ABSTRACT

Disclosed is a semiconductor device including a gate wiring, an active layer, a gate insulating film, a first wiring, a second wring, and a first semiconductor film. The gate wiring includes a gate electrode. The active layer overlaps with the gate electrode and contains an oxide semiconductor. The gate insulating film is sandwiched by the gate electrode and the active layer. The first wiring and the second wiring are each located over the active layer and respectively include a first terminal and a second terminal which are electrically connected to the active layer. The first semiconductor film is located under and in contact with the first wiring and contains the oxide semiconductor.

18 Claims, 12 Drawing Sheets

SEMICONDUCTOR DEVICE AND DISPLAY DEVICE

CROSS REFERENCE TO RELATED APPLICATIONS

This application is based on and claims the benefit of priority from the prior Japanese Patent Application No. 2020-037740, filed on Mar. 5, 2020, the entire contents of which are incorporated herein by reference.

BACKGROUND OF THE INVENTION

Field

An embodiment of the present invention relates to a semiconductor device, a manufacturing method of the semiconductor device, or a display device including the semiconductor device.

Description of the Related Art

Group 14 elements such as silicon and germanium are represented as a typical example exhibiting semiconductor properties. In particular, silicon has been used in almost all of the semiconductor devices represented by a display device due to its widespread availability, facility in processing, excellent semiconductor properties, ease of controlling its properties, and the like, and has been positioned as a material supporting the base of the electronics industry.

In recent years, semiconductor properties have been found in oxides, particularly oxides of Group 13 elements such as indium and gallium, which motivated tremendous research and development. For example, as disclosed in Japanese Patent Application Publication No. 2013-254950, a semiconductor device in which a transistor including an oxide semiconductor is incorporated and a display device utilizing the semiconductor device have been developed.

BRIEF SUMMARY OF THE INVENTION

An embodiment of the present invention is a semiconductor device. The semiconductor device possesses a gate wiring, an active layer, a gate insulating film, a first wiring, a second wiring, and a semiconductor film. The gate wiring includes a gate electrode. The active layer overlaps with the gate electrode and contains an oxide semiconductor. The gate insulating film is sandwiched by the gate electrode and the active layer. The first wiring and the second wiring are each located over the active layer and respectively include a first terminal and a second terminal which are electrically connected to the active layer. The first semiconductor film is located under and in contact with the first wiring and includes the oxide semiconductor.

An embodiment of the present invention is a display device. The display device possesses a pixel, a gate wiring, and a first wiring. The gate wiring includes a gate electrode. The first wiring intersects the gate wiring and includes a first terminal. The pixel possesses a transistor, a first semiconductor film, and a display element. The transistor includes the gate electrode, an active layer overlapping with the gate electrode and containing an oxide semiconductor, a gate insulating film sandwiched by the gate electrode and the active layer, and a first terminal located over the active layer and electrically connected to the active layer. The first semiconductor film is located under and in contact with the first wiring and contains the oxide semiconductor. The display element is electrically connected to the transistor.

An embodiment of the present invention is a manufacturing method of a semiconductor device. The manufacturing method includes: forming, over a substrate, a gate wiring including a gate electrode, an active layer overlapping with the gate electrode, a gate insulating film sandwiched by the gate electrode and the active layer, and a first semiconductor film; and forming, over the active layer, a first wiring and a second wiring respectively including a first terminal and a second terminal which are electrically connected to the active layer. The active layer and the first semiconductor film are simultaneously formed and each contain an oxide semiconductor. The first wiring is arranged to be located over and in contact with the first semiconductor film.

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or roles different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the claims, an expression "a structure is exposed from another structure" means a mode in which a part of the structure is not covered by the other structure and includes a mode where the part uncovered by the other structure is further covered by another structure.

First Embodiment

In the present embodiment, a structure of a semiconductor device 100 according to an embodiment of the present invention and a manufacturing method thereof are explained using FIG. 1A to FIG. 7B.

1. Structure of Semiconductor Device 1-1. Fundamental Structure

Figure 1A:
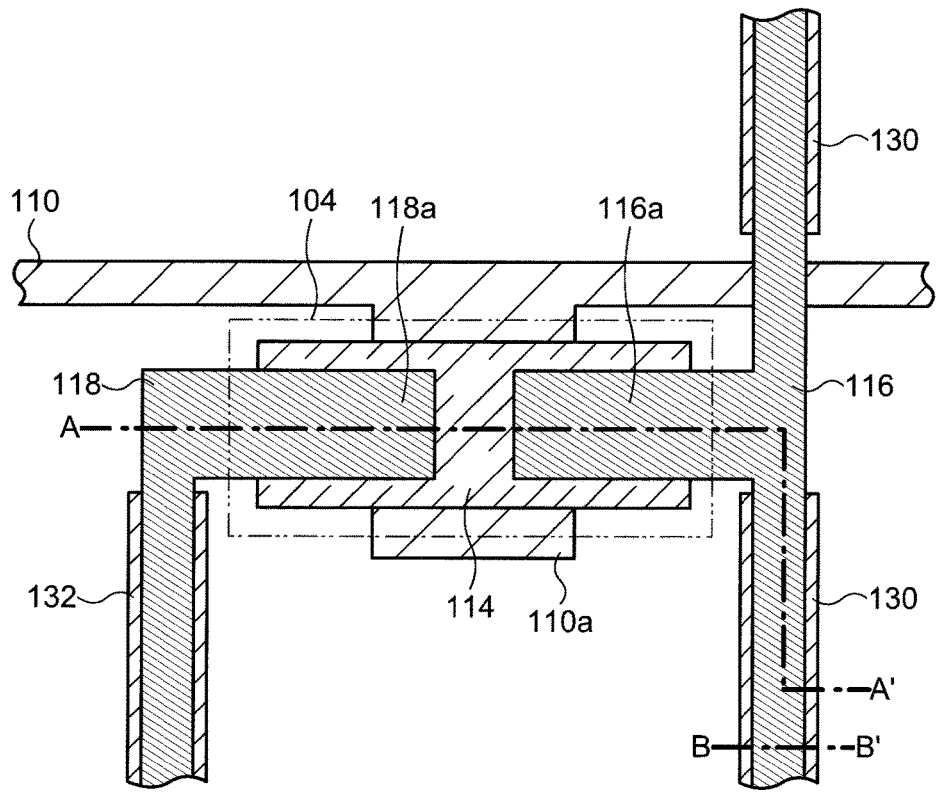
FIG. 1A and FIG. 1B are respectively schematic top and cross-sectional views of a semiconductor device according to an embodiment of the present invention.
Figure 1B:
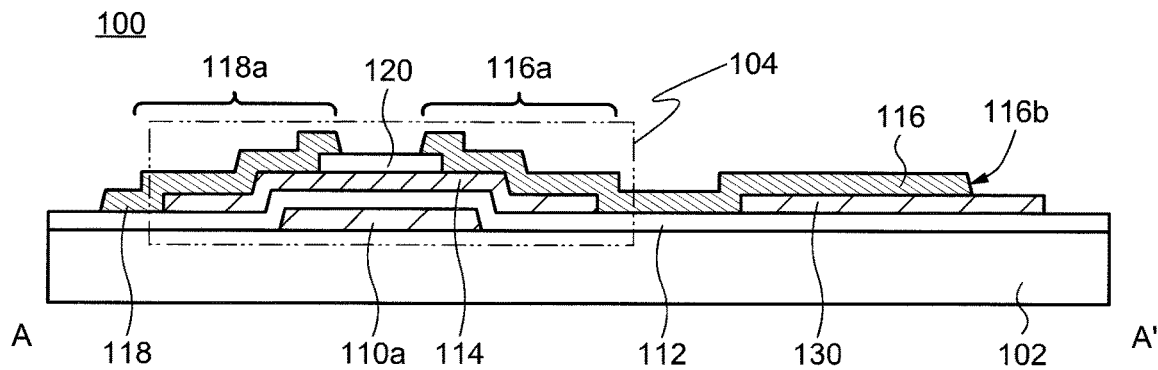

A schematic top view of the display device 100 is shown in FIG. 1A, and a schematic view of a cross section along a chain line A-A' in FIG. 1A is illustrated in FIG. 1B. The semiconductor device 100 possesses, as a fundamental structure, a transistor 104 provided over a substrate 102 and a plurality of wirings connected to the transistor 104. Specifically, the semiconductor device 100 includes a gate wiring 110, a semiconductor film 114, and a gate insulating film 112 sandwiched by the gate wiring 110 and the semiconductor film 114 as well as a first wiring 116 and a second wiring 118 which are each located over the semiconductor film 114 and electrically connected to the semiconductor film 114 as shown in FIG. 1A and FIG. 1B. The semiconductor device 100 further includes at least one of a first electron-trapping film 130 and a second electron-trapping film 132. The first electron-trapping film 130 and the second electron-trapping film 132 are respectively located under and in contact with the first wiring 116 and the second wiring 118. The first electron-trapping film 130 and the second electron-trapping film 132 may overlap with the gate wiring 110 but are preferred to be arranged so as not to overlap with the gate wiring 110 in order to prevent an increase in parasitic capacitance.

1-2. Wiring

The gate wiring 110 includes, as a part thereof, a gate electrode 110a functioning as a gate terminal of the transistor 104 and is configured to be supplied with a signal (or a potential) for controlling the behavior (ON and OFF) of the transistor 104. In FIG. 1A, the gate electrode 110a is illustrated as a portion protruding downward from the gate wiring 110. The gate electrode 110a may be integrated with the gate wiring 110 as a portion of the gate wiring 110 as shown in FIG. 11A but may be provided as an independent electrode electrically connected to the gate wiring 110 although not illustrated. The gate wiring 110 is formed as a single metal film or a stack of a plurality of metal films. As a metal included in the metal film, titanium, tungsten, tantalum, molybdenum, aluminum, copper, or an alloy containing at least one of these metals is represented.

The first wiring 116 is a wiring located over the semiconductor film 114, intersecting the gate wiring 110, and includes a first terminal 116a in electrical and physical contact with the semiconductor film 114. The first wiring 116 is configured to supply a variety of signals to the semiconductor film 114 through the first terminal 116a. In FIG. 1A, the first terminal 116a is illustrated as a portion protruding leftward from the first wiring 116. Similar to the gate wiring 110, the first terminal 116a may be integrated with the first wiring 116 as a portion of the first wiring 116 but may be formed as an independent terminal electrically connected to the first wiring 116.

The second wiring 118 is also arranged to be located over the semiconductor film 114. Similar to the first wiring 116, the second wiring 118 may also be arranged so as to intersect the gate wiring 110. The second wiring 118 also includes a second terminal 118a in electrical and physical contact with the semiconductor film 114 and corresponds to a portion protruding rightward from the second wiring 118 as shown in FIG. 1A. Similar to the gate wiring 110, the second terminal 118a may also be integrated with the second wiring 118 as a portion of the second wiring 118 or may be formed as an independent terminal electrically connected to the second wiring 118. In an ON state of the transistor 104, signals (potentials) supplied from the first wiring 116 through the first terminal 116a are input to the second wiring 118 through the semiconductor film 114, and the signals may be further supplied to a variety of elements (not illustrated) connected to the second wiring 118.

The first wiring 116 and the second wiring 118 may also include a metal or an alloy usable for the gate wiring 118. Moreover, the first wiring 116 and the second wiring 118 may each have a single-layer structure or a stacked-layer structure.

The first terminal 116a functions as a source electrode or a drain electrode of the transistor 104. The second terminal 118a functions as a drain electrode when the first terminal 116a functions as a source electrode and functions as a source electrode when the first terminal 116a functions as a drain electrode. Whether the first terminal 116a and the second terminal 118a function as a source electrode or a drain electrode is determined by the type of carrier and the direction of current flowing in the semiconductor film 114.

1-3. Semiconductor Film

The semiconductor film 114 contains an oxide semiconductor and functions as an active layer of the transistor 104. The oxide semiconductor may be selected from oxides of Group 13 elements such as indium and gallium. The oxide semiconductor may contain a plurality of different Group 13 elements and is exemplified by indium-gallium oxide (IGO). The oxide semiconductor may further contain a Group 12 element. As a typical oxide semiconductor containing a Group 12 element, indium-gallium-zinc oxide (IGZO) is represented. The semiconductor film 114 may contain another element and may contain a Group 14 element such as tin or a Group 4 element such as titanium and zirconium.

1-4. Gate Insulating Film

The gate insulating film 112 is an insulating film disposed so as to be sandwiched by the gate wiring 110 including the gate electrode 110a and the semiconductor film 114. Typically, the gate insulating film 112 is structured by a single film or a plurality of films including a silicon-containing inorganic compound such as silicon oxide and silicon nitride or an inorganic insulator having a high permittivity such as hafnium silicate, zirconium silicate, hafnium oxide, and zirconium oxide. Preferably, the gate insulating film 112 is structured as a single film containing silicon oxide or as a stack of a plurality of films so that the film in contact with the semiconductor film 114 contains silicon oxide. With this structure, it is possible to suppress the entrance of impurities which may serve as a carrier-generating source such as hydrogen into the semiconductor film 114. Accordingly, generation of levels caused by impurities can be prevented in the semiconductor film 114.

The transistor 104 is formed by the gate electrode 110a, the gate insulating film 112, the semiconductor film 114, the first terminal 116a, and the second terminal 118a.

1-5. Electron-Trapping Film

As described above, the semiconductor device 100 possesses at least one of the first electron-trapping film 130 and the second electron-trapping film 132. Although an example is shown in FIG. 1A and FIG. 1B where both of the first electron-trapping film 130 and the second electron-trapping film 132 are provided, the first electron-trapping film 130 may be disposed under the first wiring 116 and no electron-trapping film may be disposed under the second wiring 118. Preferably, the first electron-trapping film 130 or the second electron-trapping film 132 is arranged under the wiring selected from the first wiring 116 and the second wiring 118 and having a larger area. For example, in the case where the first wiring 116 is connected to a circuit located at an edge portion of the substrate 102 and the second wiring 118 is a wiring for connecting the transistor 104 to an element arranged in a vicinity of the circuit, the first wiring 116 generally has a larger area. In this case, it is sufficient that only the first electron-trapping film 130 is provided.

The first electron-trapping film 130 is formed so as to overlap with a part of a portion of the first wiring 116 which does not overlap with the semiconductor film 114. For example, the first electron-trapping film 130 may be disposed so as to overlap with a portion of the first wiring 116 other than the first terminal 116a. In a similar way, the second electron-trapping film 132 is formed so as to overlap with a part of a portion of the second wiring 118 which does not overlap with the semiconductor film 114. For example, the second electron-trapping film 132 may be disposed so as to overlap with a portion of the second wiring 118 other than the second terminal 118a.

As described below, the first electron-trapping film 130 and the second electron-trapping film 132 each exist in the same layer as the semiconductor film 114. That is, the first electron-trapping film 130, the second electron-trapping film 132, and the semiconductor film 114 are arranged as films spaced away from one another but are formed in the same process and have the same composition and thickness. Hence, the first electron-trapping film 130 and the second electron-trapping film 132 are each a semiconductor film. In the transistor 104 serving as a so-called bottom-gate type transistor, the semiconductor film 114 is located over the gate electrode 110a through the gate insulating film 112, and the first electron-trapping film 130 and the second electron-trapping film 132 are also located over the gate insulating film 112.

Figure 2A:
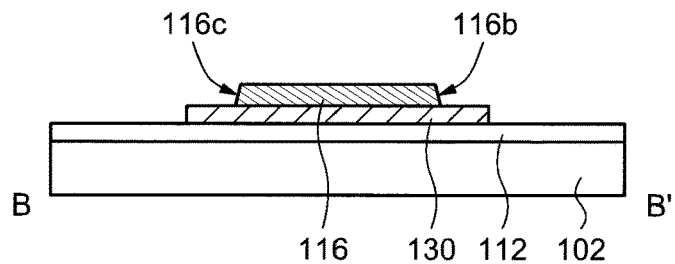
FIG. 2A to FIG. 2D are schematic cross-sectional views of a semiconductor device according to an embodiment of the present invention.
Figure 2B:
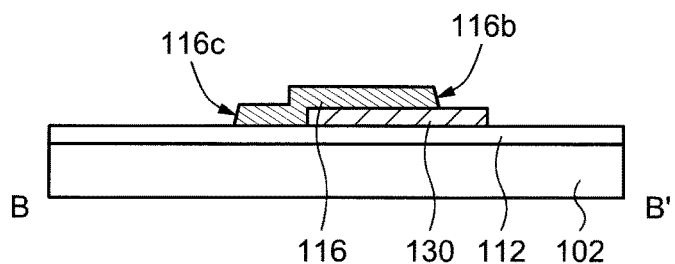
Figure 2C:
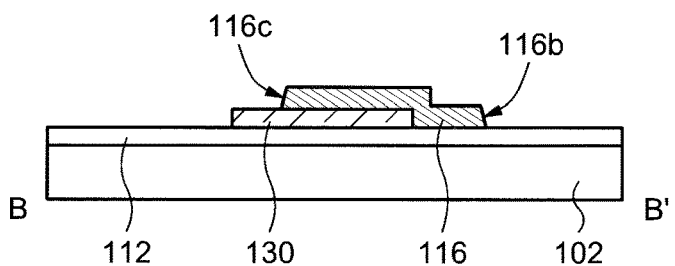
Figure 2D:
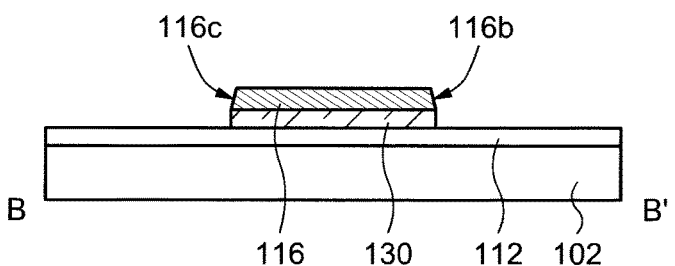

Here, the first electron-trapping film 130 is partially covered by the first wiring 116, and at least a part thereof is exposed from the first wiring 116 as shown in FIG. 1A and FIG. 1B. In a similar way, the second electron-trapping film 132 is also partially covered by the second wiring 118, and at least a part thereof is exposed from the second wiring 118. In other words, a side surface 116b of the first wiring 116 overlaps with the first electron-trapping film 130 (FIG. 1B). For example, as demonstrated by the schematic cross-sectional views along a chain line B-B' (FIG. 2A to FIG. 2D), both of the side surface 116b of the first wiring 116 and a side surface 116c opposing the side surface 116b may overlap with a top surface of the first electron-trapping film 130 (FIG. 2A). Alternatively, the first wiring 116 and the first electron-trapping film 130 may be arranged so that one of the side surfaces 116b and 116c overlaps with the top surface of the first electron-trapping film 130 while the other does not overlap with the top surface of the first electron-trapping film 130 (FIG. 2B, FIG. 2C). Alternatively, the side surface 116b and/or 116c may be aligned with a side surface of the first electron-trapping film 130 as shown in FIG. 2D. That is, bottom sides of the side surfaces 116b and/or 116b (the sides on the side of the first electron-trapping film 130) may match the top sides of the side surface of the first electron-trapping film 130. The same is applied to the arrangement relationship between the second electron-trapping film 132 and the second wiring 118.

1-6. Other Structures

In the semiconductor device 100, a channel-protection film 120 for protecting a channel formed in the semiconductor film 114 may be provided, as an optional element, over the semiconductor film 114 so as to be in contact with the semiconductor film 114. The channel-protection film 120 may be also structured with a film including a silicon-containing inorganic compound such as silicon oxide. The channel-protection film 120 is formed so as to be covered by the first terminal 116a and the second terminal 118a.

The semiconductor device 100 may have an insulating film for protecting the transistor 104 over the first wiring 116 and the second wiring 118 although not illustrated in FIG. 1A and FIG. 1B. The insulating film may be an inorganic film including a silicon-containing inorganic compound such as silicon oxide and silicon nitride or a polymer film such as an epoxy resin, an acrylic resin, a silicon resin, and a polyimide resin. Alternatively, the insulating film may be a stack of an inorganic film and a polymer film. When a polymer film is used, the insulating film may be formed so that a top surface thereof is flat.

2. Modified Example 2-1. Shape and Arrangement of Electron-Trapping Film

In the example shown in FIG. 1A, the first electron-trapping film 130 and the second electron-trapping film 132 are arranged so as to respectively extend in the directions in which the first wiring 116 and the second wiring 118 extend, that is, so as to respectively extend in the longitudinal directions of the first wiring 116 and the second wiring 118. However, the shape and arrangement of the first electron-trapping film 130 and the second electron-trapping film 132 are not limited thereto. Namely, there is no limitation to the plane shape of the first electron-trapping film 130, and the electron-trapping film 130 may have any shape as long as a part thereof is covered by the first wiring 116 and the other part thereof is exposed from the first wiring 116 as demonstrated in FIG. 3A and a schematic view (FIG. 3B) of a cross section along a chain line C-C' in FIG. 3A. That is, the first electron-trapping film 130 may be provided in any shape and arrangement as long as a region (first region) 130a is covered by the first wiring 116 and a region (second region) 130b other than the first region 130a is exposed from the first wiring 116. Preferably, the first electron-trapping film 130 is configured so that the first region 130a has a larger area than the second region 130b. The same is applied to the second electron-trapping film 132.

2-2. Structure of Transistor

Figure 4:
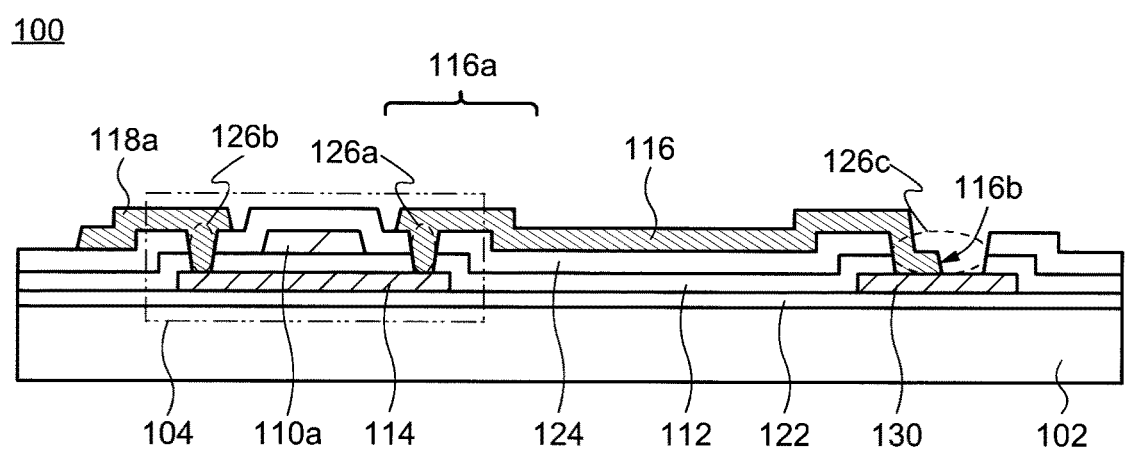
FIG. 4 is a schematic cross-sectional view of a semiconductor device according to an embodiment of the present invention.

The transistor 104 may have a top-gate structure. Here, the semiconductor device 100 having the top-gate type transistor 104 in which the first electron-trapping film 130 is provided is explained using FIG. 4. FIG. 4A is a schematic cross-sectional view corresponding to FIG. 1B.

When the transistor 104 has a top-gate structure, it is preferred to provide an undercoat 122 so as to be in contact with the substrate 102 in order to prevent the entrance of impurities such as a sodium ion to the semiconductor film 114 from the substrate 102. The undercoat 122 may be structured with one of a plurality of films including a silicon-containing inorganic compound. When the undercoat 122 is a single film, a film containing silicon oxide is preferred as the undercoat 122. When the undercoat 122 is structured with stacked films, it is preferred that the upmost layer (the layer positioned farthest from the substrate 102 or in contact with the semiconductor film 114) be a film including silicon oxide.

The semiconductor film 114 is disposed over the substrate 102 through the undercoat 122, and the first wiring 116 is arranged so that the gate electrode 110a overlaps with the semiconductor film 114 through the gate insulating film 112 formed over the semiconductor film 114. Furthermore, an interlayer insulating film 124 covering the gate electrode 110a is formed. Similar to the undercoat 122, the interlayer insulating film 124 may be structured with a single or a plurality of films including a silicon-containing inorganic compound.

The gate insulating film 112 and the interlayer insulating film 124 are each provided with openings 126a and 126b for electrically connecting the first terminal 116a and the second terminal 118a to the semiconductor film 114 as well as opening 126c for exposing the first electron-trapping film 130. The openings 126a and 126b are respectively covered by the first terminal 116a and the second terminal 118a. On the other hand, in the opening 126c, the first wiring 116 does not cover the whole of the top surface of the first electron-trapping film 130 but is provided so that a part of the top surface of the first electron-trapping film 130 is exposed from the first wiring 116. This structure allows the side surface 116b of the first wiring 116 to overlap with the top surface of the first electron-trapping film 130.

3. Manufacturing Method of Semiconductor Device

Hereinafter, a manufacturing method of the semiconductor device 100 shown in FIG. 1A and FIG. 1B is explained using FIG. 5A to FIG. 7B. Here, an example is explained where the first electron-trapping film 130 is formed as an electron-trapping film in the semiconductor device 100. FIG. 5A to FIG. 7A are schematic cross-sectional views corresponding to FIG. 1B.

Figure 5A:
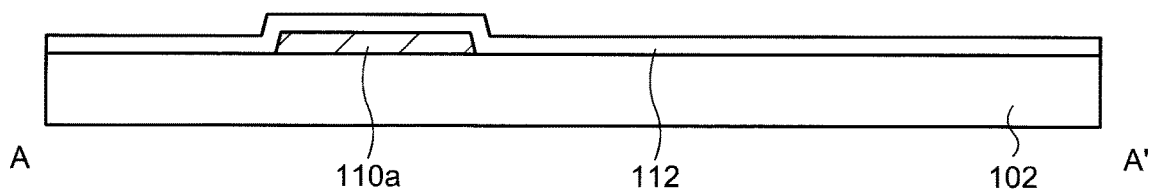
FIG. 5A to FIG. 5D are schematic cross-sectional views showing a manufacturing method of a semiconductor device according to an embodiment of the present invention.

First, the gate wiring 110 including the gate electrode 110a is formed over the substrate 102 by utilizing a chemical vapor deposition (CVD) method or a sputtering method as shown in FIG. 5A. The substrate 102 may include glass, quartz, metal, ceramics, and the like. When flexibility is provided to the semiconductor device 100 or an electronic device including the semiconductor device 100, such as a display device, a polymer material may be used for the substrate 102. As a polymer material, a polyimide, a polyamide, a polyester, a polycarbonate, and the like are exemplified. When a polymer material is used, the substrate 102 may be fabricated by forming a film of the polymer material over a supporting substrate which is not illustrated. The film formation of the polymer material can be conducted using an ink-jet method, a spin-coating method, a printing method, or the like. The supporting substrate is peeled and removed after manufacturing the semiconductor device 100. Although not illustrated, the undercoat 122 may be formed over the substrate 102 prior to the formation of the gate wiring 110.

The gate insulating film 112 is sequentially formed so as to cover the gate wiring 110 including the gate electrode 110a (FIG. 5A). The gate insulating film may also be formed with a CVD method or a sputtering method. The gate insulating film 112 may be formed as a stack of silicon-nitride film/silicon-oxide film or a stack of silicon-oxide film/silicon-nitride film/silicon-oxide film, for example. As described above, it is preferred to form the gate insulating film 112 so that the silicon-oxide film is the layer in direct contact with the semiconductor film 114, namely, the upmost layer in FIG. 5A in order to suppress the generation of impurity levels which may cause carrier generation in the semiconductor film 114. It is preferred that the atmosphere during the film-formation contain a hydrogen-containing gas such as hydrogen gas as little moisture as possible when the gate insulating film 112 is formed, thereby leading to the formation of the gate insulating film 112 having an oxygen composition the same as or close to a stoichiometry.

Figure 5B:
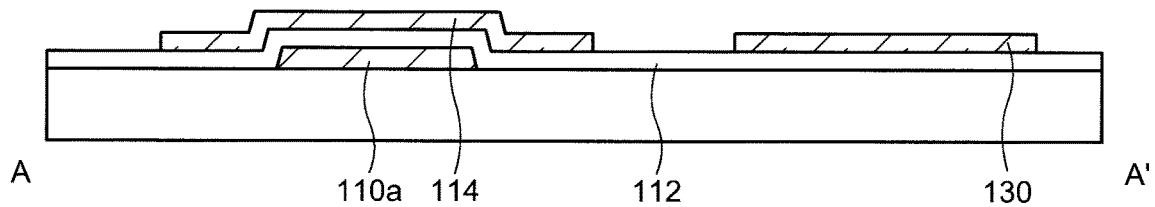

After that, the semiconductor film 114 and the first electron-trapping film 130 are simultaneously formed in the same process (FIG. 5B). These films are prepared utilizing a sputtering method or the like to have a thickness of 20 nm to 100 nm or 30 nm to 80 nm, for example, and then patterned in the sequential etching using a resist mask. When a sputtering method is used, the film formation may be carried out under an atmosphere including oxygen gas exemplified by a mixed gas atmosphere of argon and oxygen gas, for example. At this time, a partial pressure of argon may be smaller than a partial pressure of the oxygen gas. In the case where the second electron-trapping film 132 is provided, the second electron-trapping film 132 may also be simultaneously formed in the same process as the formation of the first electron-trapping film 130.

It is preferred that the semiconductor film 114 have a reduced crystal defect such as an oxygen defect. Hence, it is preferred to perform a heating treatment (annealing) after forming the semiconductor film 114 and the first electron-trapping film 130. The heating treatment may be conducted before or after patterning the semiconductor film 114 and the first electron-trapping film 130. It is preferred to perform the heating treatment before patterning because the semiconductor film 114 and the first electron-trapping film 130 may be decreased in volume (shrinking) by the heating treatment. The heating treatment may be carried out at a normal or reduced pressure in the presence of nitrogen, dried air, or the atmosphere. The heating temperature may be selected from the range of 250° C. to 500° C. or 350° C. to 450° C., and the heating time may be selected from the range of 15 minutes to 1 hour. However, the heating treatment may be conducted outside these ranges. Oxygen is introduced or migrated to the oxygen defect in the semiconductor film 114 or the first electron-trapping films 130 by the heating treatment, resulting in the well-defined semiconductor film 114 and the first electron-trapping film 130 having a reduced crystal defect and high crystallinity. Accordingly, it is possible to obtain the transistor 104 having excellent electrical properties such as high reliability, a low off current, and low variation in properties (threshold voltage).

Figure 5C:
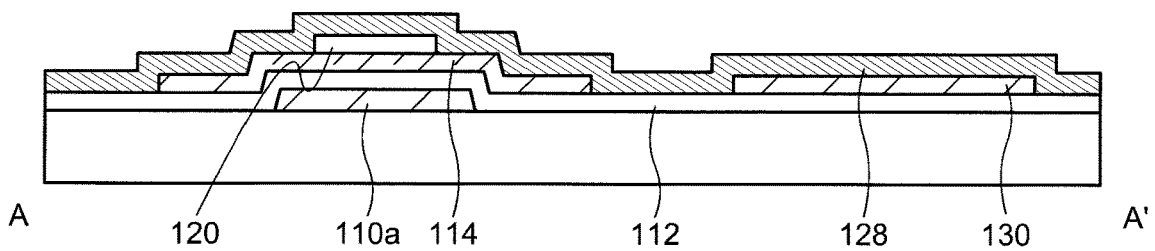
Figure 5D:
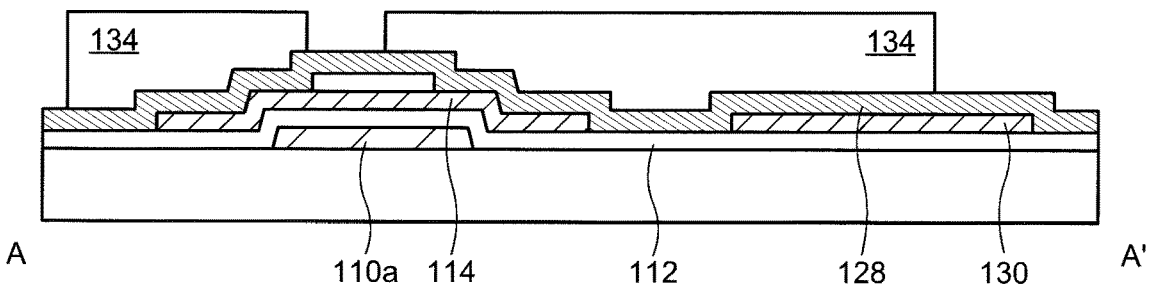

In the case where the channel-protection film 120 is formed, a film including a silicon-containing inorganic compound such as silicon oxide and silicon nitride may be formed over the semiconductor film 114 as the channel-protection film 120 by utilizing a CVD method or a sputtering method, similar to the formation of the gate insulating film 112 (FIG. 5C). When the channel-protection film 120 has a single-layer structure, it is preferred to use a silicon-oxide film. When the channel-protection film 120 has a stacked-layer structure, it is preferred to configure the channel-protection film 120 so that a silicon-oxide film is in contact with the semiconductor film 114. It is preferred that the channel-protection film 120 be also formed under the atmosphere including a hydrogen-contain gas at a concentration as low as possible.

After that, a metal film 128 is formed over the whole of or substantially the whole of a surface of the substrate 102 so as to cover the semiconductor film 114 and the first electron-trapping film 130 (FIG. 5C). The metal film 128 may also be formed by applying a CVD method or a sputtering method. A resist mask 134 is further prepared over the metal film 128. The resist mask 134 can be formed by applying a precursor of the resist mask 134 over the whole of or substantially the whole of the surface of the substrate 102 utilizing a spin-coating method, an ink-jet method, or the like, followed by light exposure through a photomask and sequentially performing development.

After that, the metal film 128 is subjected to patterning by etching. The etching may be wet etching or dry etching, but dry etching is preferred because patterning by dry etching is capable of providing a shape closer to a resist mask pattern.

Figure 6A:
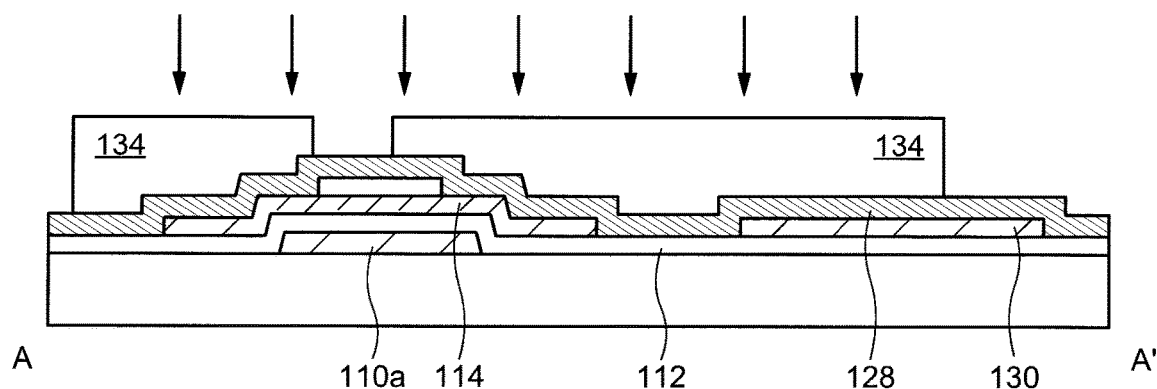
FIG. 6A and FIG. 6B are schematic cross-sectional views showing a manufacturing method of a semiconductor device according to an embodiment of the present invention.
Figure 6B:
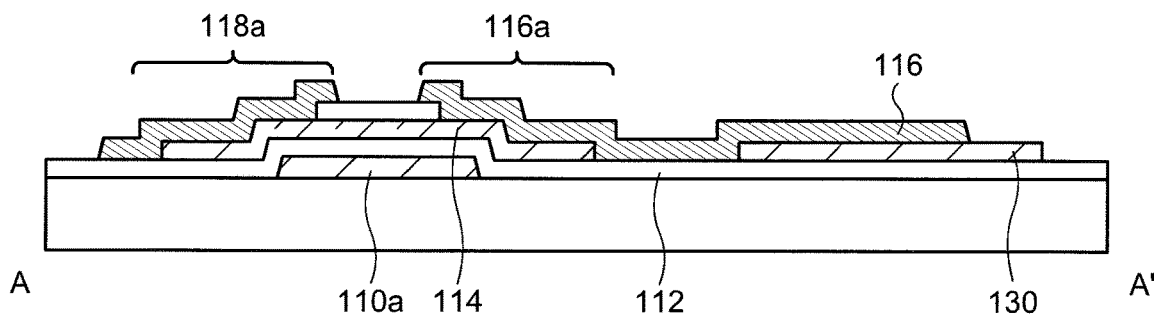

When dry etching is performed, a reactive gas such as halogenated carbon exemplified by tetrafluoromethane, tetrachloroethane, and the like, nitrogen trifluoride, a chlorine compound exemplified by boron trichloride, silicon tetrachloride, chlorine, hydrogen chloride, and the like, or a bromine compound exemplified by boron tribromide, hydrogen bromine, and the like in addition to an inert gas such as helium and argon are introduced into a chamber, and the substrate 102 is arranged between a pair of electrodes. A high frequency voltage having a frequency of 13.56 MHz, 2.45 GHz or the like is applied between the pair of electrodes to generate a plasma of the reactive gas. The plasma of the reactive gas, that is, the cations and electrons resulting from the reactive gas are accelerated by a potential difference between the electrodes and collide with the metal film 128 over the substrate 102 at high speed (FIG. 6A). The metal film 128 is gradually etched by the collision of the cations by which the portion which is not covered by the resist mask 134 is removed to form the first wiring 116 and the second wiring 118. After that, the resist mask 134 is removed, thereby providing the semiconductor device 100 (FIG. 6B).

Figure 7A:
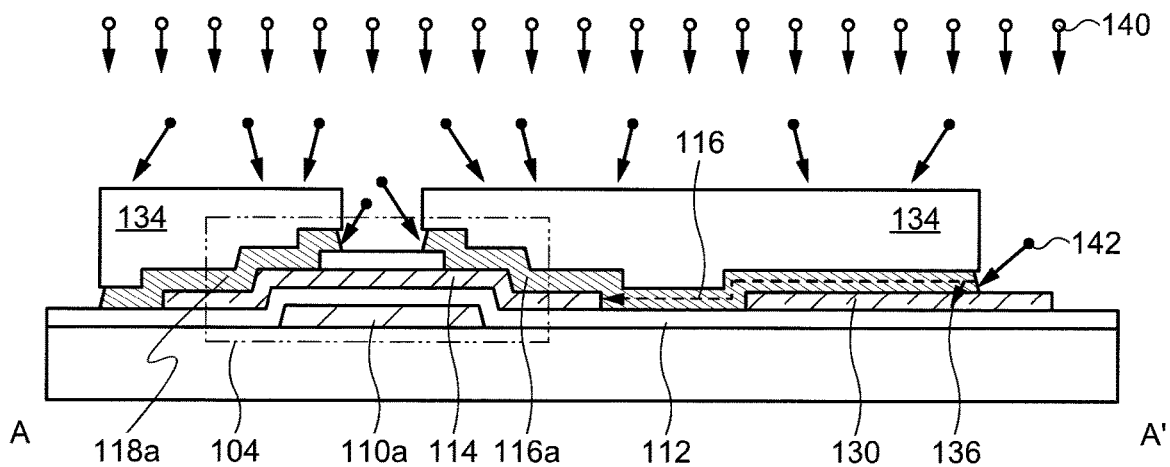
FIG. 7A is a schematic cross-sectional view explaining an etching process for manufacturing a semiconductor device.

In the dry etching, the cations 140 in the plasma are accelerated in a direction substantially perpendicular to the substrate 102 as shown in FIG. 7A. On the other hand, although most electrons 142 are accelerated almost perpendicularly to the substrate 102, the directivity thereof is lower than that of the cations 140 as the mass of electrons 142 is much lower than that of the cations 140. Hence, although the electrical neutrality is substantially maintained at the top surfaces of the metal film 128 and the resist mask 134, the probability of the electrons 142 colliding with a side surface of the metal film 128 is higher than that of the cations 140. As a result, the side surface of the metal film 128 becomes an electron-excessive state, and the electrons 142 enter the metal film 128 causing the metal film 128 to be negatively charged. For example, the electrons 142 enter the side surfaces of the first terminal 116a and the second terminal 118a in the transistor 104 as shown in FIG. 7A, which causes these terminals to be negatively charged.

However, in the case where the semiconductor device 100 is applied to an electronic device such as a display device, the side surfaces of the first wiring 116 and the second wiring 118 each have a larger area than the side surfaces of the first terminal 116a and the second terminal 118a as can be understood from FIG. 1A. Hence, the side surface of the first wiring 116 other than that of the first terminal 116a and the side surface of the second wiring 118 other than that of the second terminal 118a significantly contribute to the entrance of the electrons 142 during etching.

Figure 7B:
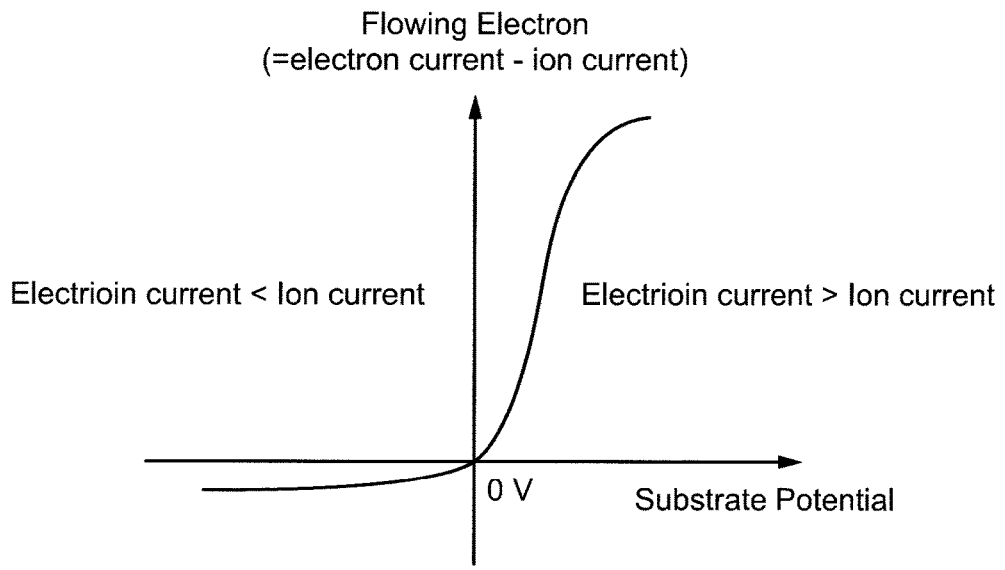
FIG. 7B is a schematic view showing a relationship between a substrate potential and a current reaching the substrate.

If excessive electrons enter the side surface of the first wiring 116, the first wiring 116 is negatively charged and the electrons further flow to the semiconductor film 114 (see the dotted arrow in FIG. 7A). Accordingly, the potential of the semiconductor film 114 is negatively shifted. Here, the relationship between the potential of the substrate 102 and the current (electron current and ion current) reaching the substrate 102 is asymmetric with respect to a floating potential (0 V) as a border as shown in FIG. 7B. Hence, it is necessary to provide a large negative potential to the substrate 102 in order to resolve the −excessive electron state. As a result, the cations 140 accelerated by this large negative potential damage the channel of the semiconductor film 114 through the channel-protection film 120. Generation of such damage causes a crystal defect or an impurity level in the semiconductor film 114, which not only shifts the initial properties of the transistor 104 but also decreases the reliability of the semiconductor device 100 including the transistor 104.

However, the first electron-trapping film 130 is formed under and in contact with the first wiring 116 other than the first terminal 116a in the present embodiment. As described above, the areas of the side surfaces 116b and 116c of the first wiring 116 other than those of the first terminal 116a are larger than those of the side surfaces of the first terminal 116a (see FIG. 2A to FIG. 2D) and significantly contribute to the entrance of electrons. Therefore, most electrons entering the side surfaces 116b and 116c of the first wiring 116 flow into the first electron-trapping film 130 in contact with these side surfaces (see the solid-line arrow 136 extending to the first electron-trapping film 130 in FIG. 7A). As a result, the amount of electrons entering the semiconductor film 114 is significantly reduced, and the damage of the semiconductor film 114 is suppressed, which prevents the shift of the initial properties of the transistor 104 and contributes to an increase in reliability of the semiconductor device 100.

Figure 3A:
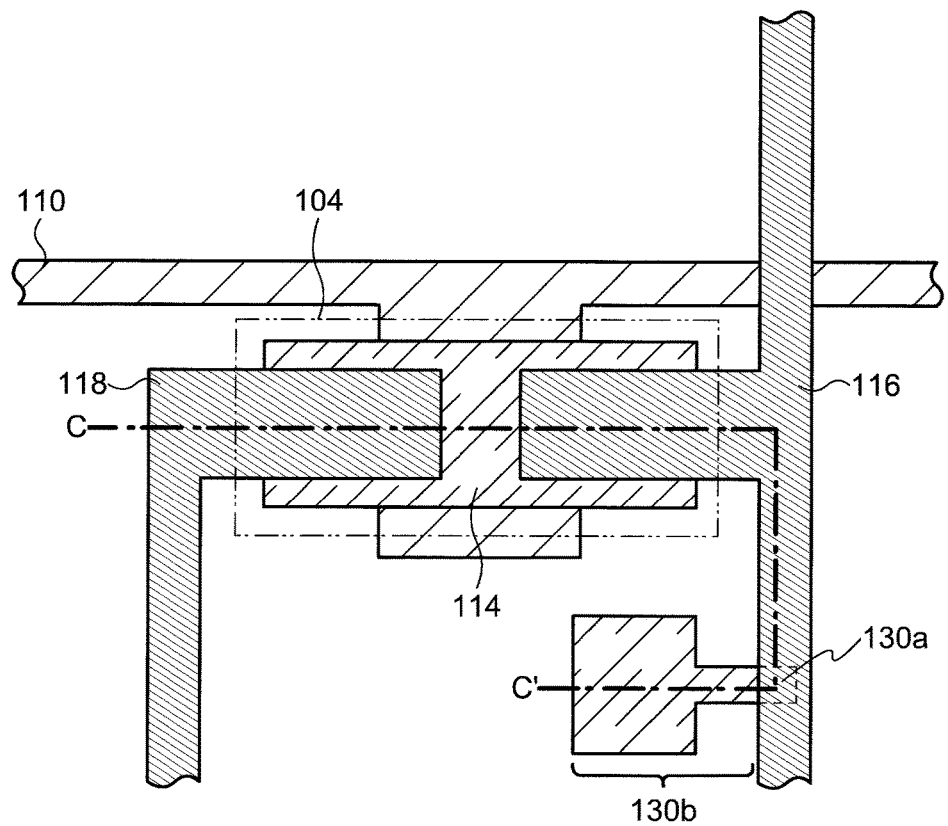
FIG. 3A and FIG. 3B are respectively schematic top and cross-sectional views of a semiconductor device according to an embodiment of the present invention.
Figure 3B:
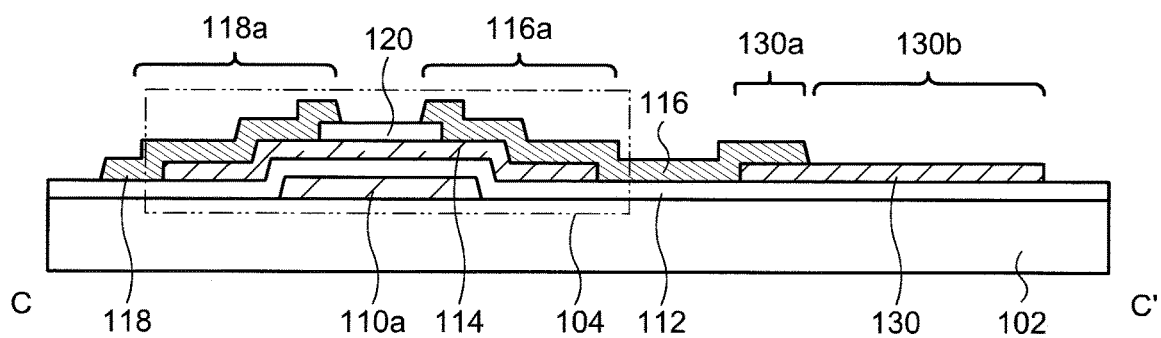

As described above, the first wiring 116 is arranged so that its side surfaces 116b and/or 116c overlap with the top surface of the first electron-trapping film 130 or are aligned with the side surfaces of the first electron-trapping film 130 (see FIG. 2A to FIG. 2D). This structure is based on a design which considers the aforementioned entrance of electrons, in which the side surfaces 116b and/or 116c of the first wiring 116 having a larger area exposed to the plasma are in contact with the first electron-trapping film 130 in order to suppress the entrance of the electrons to the semiconductor film 114. Moreover, the arrangement and the shape of the first electron-trapping film 130 shown in FIG. 3A are also based on the aforementioned principle. That is, the first region 130a which is in contact with a portion of the first wiring 116 other than the first terminal 116a is secured, by which the electrons are trapped by the second region 130b having a larger area in order to reduce the amount of electrons flowing to the semiconductor film 114 even if the contact area with the first wiring 116 is small.

Second Embodiment

In the present embodiment, a structure of a display device 150 is explained as an example of an electronic device including the semiconductor device 100. An explanation of the structures the same as or similar to those described in the First Embodiment may be omitted.

1. Structure

Figure 8:
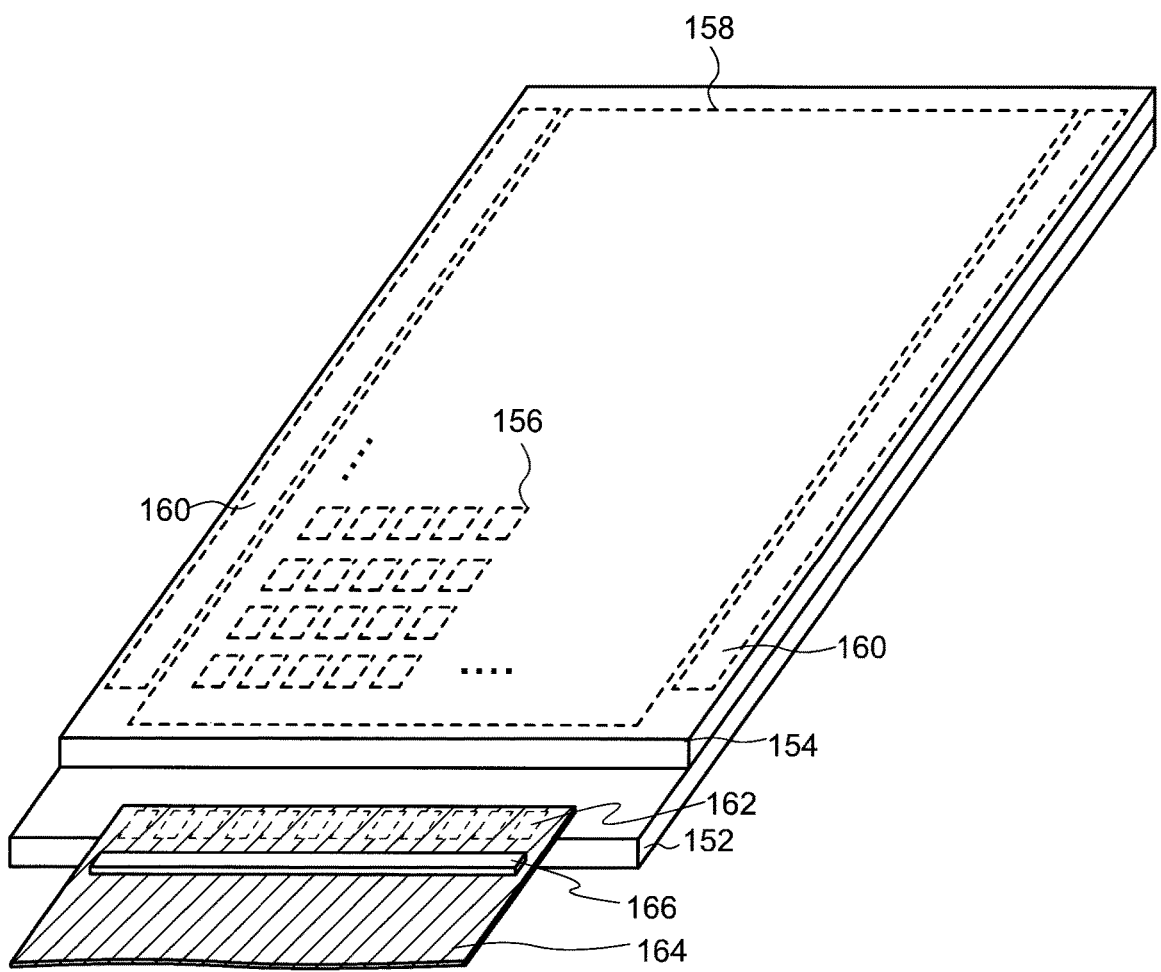
FIG. 8 is a schematic perspective view of a display device according to an embodiment of the present invention.

A schematic perspective view of the display device 150 is shown in FIG. 8. The display device 150 possesses a substrate 152 and a counter substrate 154 opposing the substrate 152, and a plurality of pixels 156 is provided to the substrate 152. The region in which the plurality of pixels 156 is arranged is a display region 158, and scanning-line driver circuits 160 for controlling the pixels 156 are further disposed outside the display region 158 (peripheral region) over the substrate 152. The counter substrate 154 is arranged over the pixels 156 and the scanning-line driver circuits 160 to protect these elements. Wirings which are not illustrated extend from the display region 158 and the scanning-line driver circuits 160 to a side of the substrate 152 and are exposed at an edge portion of the substrate 152 to form terminals 162. The terminals 162 are electrically connected to a flexible printed circuit substrate (FPC) 164, and a driver IC 166 may be mounted over the FPC 164 to control the pixels 156. Note that the driver IC 166 may not be formed over the FPC 116 but may be mounted over the substrate 152. Alternatively, a signal-line driver circuit may be formed over the substrate 152 instead of or in addition to the driver IC 166. Here, the substrate 152 corresponds to the substrate 102 in the First Embodiment.

A display element and a pixel circuit for controlling the pixel element are provided in each pixel 156. The pixel circuit includes a variety of elements such as a transistor or a capacitor element and is controlled by signals supplied from an external circuit (not illustrated) through the scanning-line driver circuits 160 as well as the driver IC 166 and/or the signal-line driver circuit. Light emission obtained from the display elements or light obtained through the display elements is controlled with the pixel circuits, by which an image is displayed on the display region 158. Although the structure of the pixel circuit is arbitrarily determined, at least one transistor 104 described in the First Embodiment is provided in each pixel circuit. The structure of the display element may be also arbitrarily selected, and the display element may be a light-emitting element, a liquid crystal element, an electrophoretic element, or the like.

2. Display Element Having Light-Emitting Element

Figure 9:
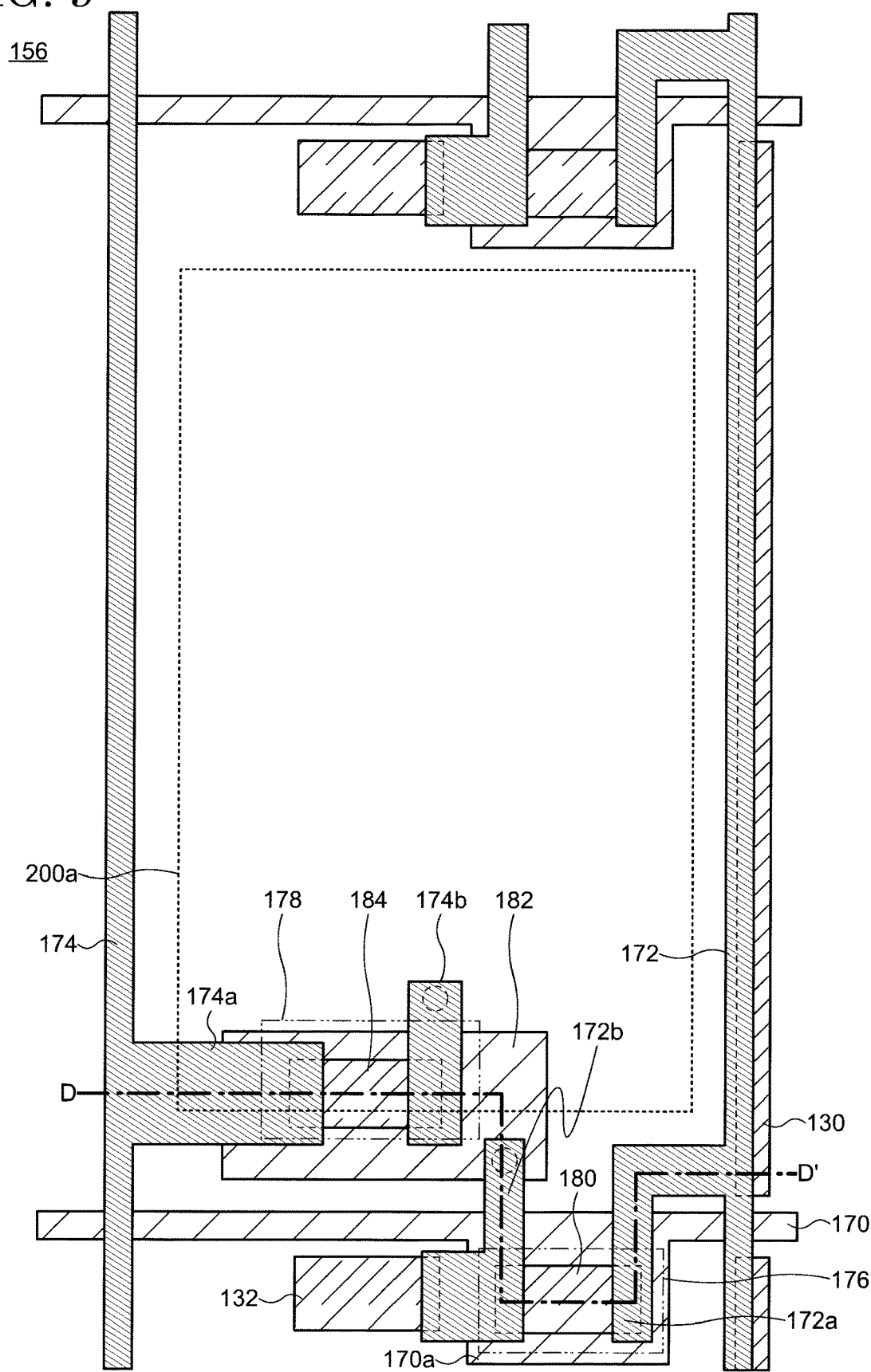
FIG. 9 is a schematic top view of a pixel of a display device according to an embodiment of the present invention.
Figure 10:
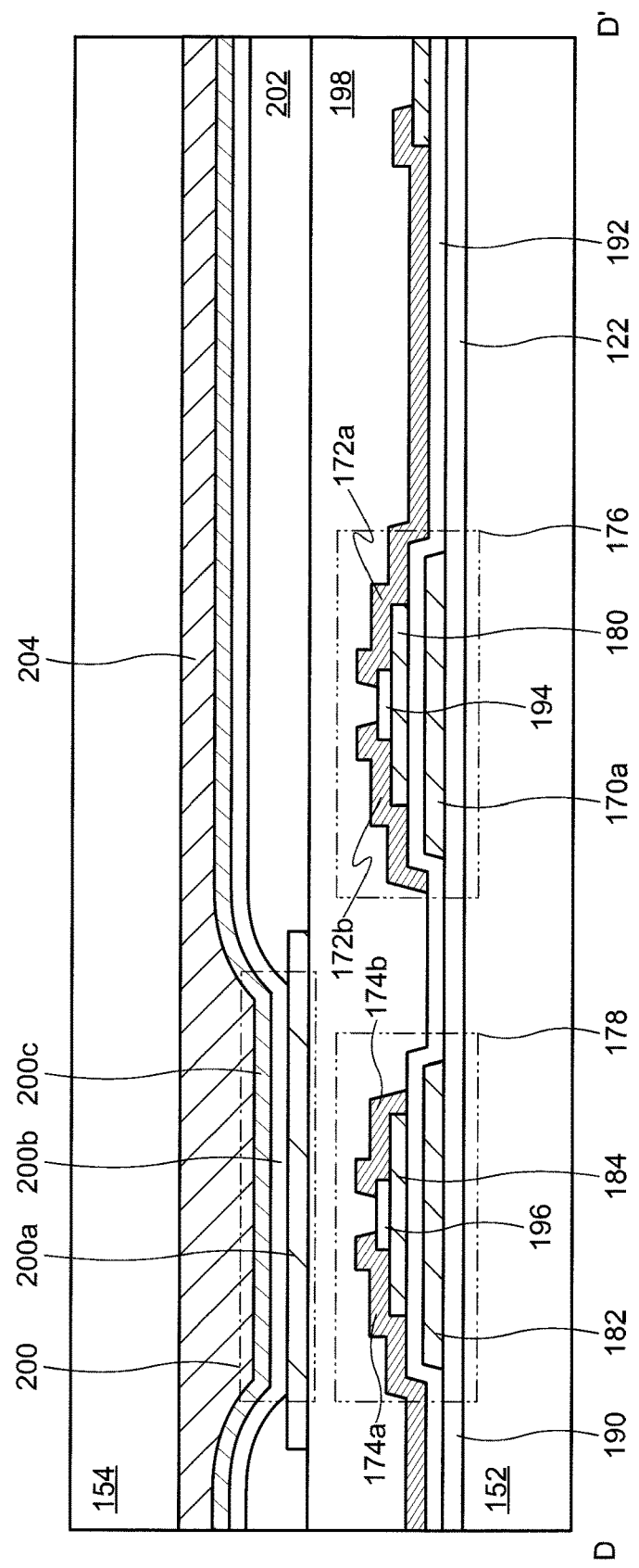
FIG. 10 is a schematic cross-sectional view of a pixel of a display device according to an embodiment of the present invention.

A schematic top view of the pixel 156 in the case of using an electroluminescent element (hereinafter, simply referred to as an EL element) 200 including an organic compound as an emission material is shown in FIG. 9. FIG. 10 is a schematic view of a cross section along a chain line D-D' in FIG. 9. Although FIG. 9 and FIG. 10 demonstrate an example where two transistors 176 and 178 are provided in one pixel 156, the structure of the pixel 156 may be arbitrarily determined. Hence, three or more transistors may be disposed in each pixel 156, and one or a plurality of elements (a capacitor element or the like) other than a transistor may be disposed.

Gate wirings 170 extending from the scanning-line driver circuits 160 as well as signal lines 172 and current-supplying lines 174 extending from the driver IC 166 or the signal-line driver circuit are provided over the substrate 152. Each pixel 156 is connected to the gate wiring 170, the signal line 172, and the current-supplying line 174. The signal lines 172 are supplied with an initializing signal for initializing the transistor 176 and an image signal corresponding to gradation data required to display an image. The gate wirings 170 are periodically supplied with a gate potential which is a constant potential, and the current-supplying lines 174 are constantly supplied with a constant potential.

The transistor 176 is structured by a gate electrode 170a which is a part of the gate wiring 170, a gate insulating film 192 covering the gate electrode 170a, and a semiconductor film 180 overlapping with the gate electrode 170a through the gate insulating film 192 as well as a first terminal 172a and a second terminal 172b located over and electrically connected to the semiconductor film 180. The transistor 176 may include a channel-protection film 194.

The transistor 178 is structured by a gate electrode 182, the gate insulating film 192 covering the gate electrode 182, and a semiconductor film 184 overlapping with the gate electrode 182 through the gate insulating film 192 as well as a first terminal 174a and a second terminal 174b located over and electrically connected to the semiconductor film 184. The first terminal 174a is a part of the current-supplying line 174. The transistor 178 may include a channel-protection film 196. The second terminal 172b of the transistor 176 is electrically connected to the gate electrode 182 of the transistor 178, which allows a potential based on the signal provided to the transistor 176 from the signal line 172 to be supplied to the gate electrode 182, thereby controlling the transistor 178.

A leveling film 198 is disposed over the transistors 176 and 178 to absorb depressions and projections caused by the transistors and to provide a flat surface, and an EL element 200 is arranged over the leveling film 198. The EL element 200 has a pixel electrode 200a, an electroluminescence layer (hereinafter, an EL layer) 200b, and a counter electrode 200c as a fundamental structure. The pixel electrode 200a is electrically connected to the second terminal 174b of the transistor 178, by which the potential supplied to the current-supplying line 174 is provided to the pixel electrode 200a through the first terminal 174a, the semiconductor layer 184, and the second terminal 174b while the transistor 178 maintains an on state. A constant potential is provided to the counter electrode 200c. When a potential difference between the pixel electrode 200a and the counter electrode 200c exceeds a threshold value of the EL layer 200b, a current flows in the EL layer 200b, by which an emission can be obtained from the EL layer 200b.

The structure of the EL layer 200b is arbitrarily selected, and the EL layer 200b may be structured with one or a plurality of functional layers composed of an organic material and/or inorganic material. As the functional layer, a carrier-injection layer, a carrier-transporting layer, and emission layer, a carrier-blocking layer, an exciton-blocking layer, and the like are represented. The known materials and structures may also be applied to the pixel electrode 200a and the counter electrode 200c, and the emission from the EL layer 200b can be utilized by configuring one of the electrodes and the other to be a reflection electrode and a light-extracting electrode, respectively.

A sealing film 204 may be formed as an optional element between the EL elements 200 and the counter substrate 154 (FIG. 10). The structure of the sealing film 204 may also be arbitrarily determined, and the sealing film 204 may be structured by applying the known materials and structures. For example, a stacked film in which a film including a polymer material such as an epoxy resin is sandwiched by inorganic films including a silicon-containing inorganic compound may be employed as the sealing film 204. Although not illustrated, a touch sensor may be further disposed over the counter electrode 154 or between the EL elements 200 and the counter substrate 154. Furthermore. a light-shielding film covering the transistors 176 and 178, the gate wirings 170, the signal lines 172, and the current-supplying lines 174 may be provided between the counter substrate 154 an the EL elements 200.

Here, at least one of the transistors 176 and 178 corresponds to the transistor 104 of the First Embodiment.

When the transistor 176 corresponds to the transistor 104, the gate wiring 170, the signal line 172, the first terminal 172a, the second terminal 172b, and the semiconductor film 180 respectively correspond to the gate wiring 110, the first wiring 116, the first terminal 116a, the second wiring 118 including the second terminal 118a, and the semiconductor film 114 of the transistor 104. The semiconductor film 180 contains an oxide semiconductor.

When the transistor 178 corresponds to the transistor 104, the gate electrode 182, the current-supplying line 174, the first terminal 174a, the second terminal 174b, and the semiconductor film 184 respectively correspond to the gate wiring 110, the first wiring 116, the first terminal 116a, the second wiring 118 including the second terminal 118a, and the semiconductor film 114 of the transistor 104. The semiconductor film 184 contains an oxide semiconductor.

Hence, when both of the transistors 176 and 178 correspond to the transistor 104, the pixel circuit is configured so that at least one of the first electron-trapping film 130 and the second electron-trapping film 132 is arranged in each of these transistors. When only the transistor 176 corresponds to the transistor 104, the pixel circuit may be configured so that at least one of the first electron-trapping film 130 and the second electron-trapping film 132 is arranged in the transistor 176. In this case, the semiconductor film 184 of the transistor 178 may not necessarily contain an oxide semiconductor and may be a semiconductor film containing a Group 14 element such as silicon. Conversely, when only the transistor 178 corresponds to the transistor 104, the pixel circuit may be configured so that at least one of the first electron-trapping film 130 and the second electron-trapping film 132 is arranged in the transistor 178. In this case, the semiconductor film 180 of the transistor 176 may not necessarily contain an oxide semiconductor and may be a semiconductor film containing a Group 14 element such as silicon.

In FIG. 9, a case is demonstrated where only the transistor 176 corresponds to the transistor 104, and hereinafter, an example is explained in which the first electron-trapping film 130 and the second electron-trapping film 132 are respectively provided to the wiring and the terminal connected to this transistor 176 (i.e., the signal line 172 and the second terminal 172b).

The first electron-trapping film 130 is disposed so as to be in contact with the signal line 172. On the other hand, the second electron-trapping film 132 is disposed so as to be in contact with the second terminal 172b. Since the signal line 172 has a larger side-surface area compared with the second terminal 172b, the second electron-trapping film 132 may not be provided but only the first electron-trapping film 130 may be disposed in the case where a sufficient area cannot be secured in the pixel 156, for example. As described in the First Embodiment, the semiconductor film 180 contains an oxide semiconductor and exists in the same layer as the first electron-trapping film 130 and the second electron-trapping film 132.

In the example demonstrated in FIG. 9, the first electron-trapping film 130 is partially covered by the signal line 172 and is disposed along the direction in which the signal line 172 extends. On the other hand, since the portion of the second terminal 172b which does not overlap with the semiconductor film 180 has a relatively small area, the second electron-trapping film 132 may be formed so as to be partially covered by the second terminal 172b as demonstrated by the modified example shown in FIG. 3A. In this case, the second electron-trapping film 132 is arranged so that the area of the portion (second region) exposed from the second terminal 172b is larger than the area of the portion (first region) covered by the second terminal 172b. The electrons entering the first terminal 172a and the second terminal 172b are respectively trapped by the first electron-trapping film 130 and the second electron-trapping film 132, by which the entrance of the electrons to the semiconductor film 180 can be suppressed. As a result, the shift of the initial properties of the transistor 176 can be suppressed, and reliability of the pixel circuit provided in each pixel 156 is increased, which also contributes to improvement of reliability of the display device 150.

Although a detailed explanation is omitted, at least one of the first electron-trapping film 130 in contact with the current-supplying line 174 and the second electron-trapping film 132 in contact with the second terminal 174b may be provided in the case where the transistor 178 corresponds to the transistor 104. In this case, it is preferred that the first electron-trapping film 130 be disposed so as to be in contact with the current-supplying line 174 having a larger side-surface area. In addition, it is not necessary for the semiconductor film 180 of the transistor 176 to contain an oxide semiconductor, and the semiconductor film 180 may be composed of a silicon film (amorphous silicon film or polysilicon film).

In a similar way, when both of the transistors 176 and 178 correspond to the transistor 104, it is preferred to dispose two first electron-trapping films 130 so as to be in contact with the signal line 172 and the current-supplying line 174, respectively.

3. Display Device Having Liquid Crystal Display

Figure 11:
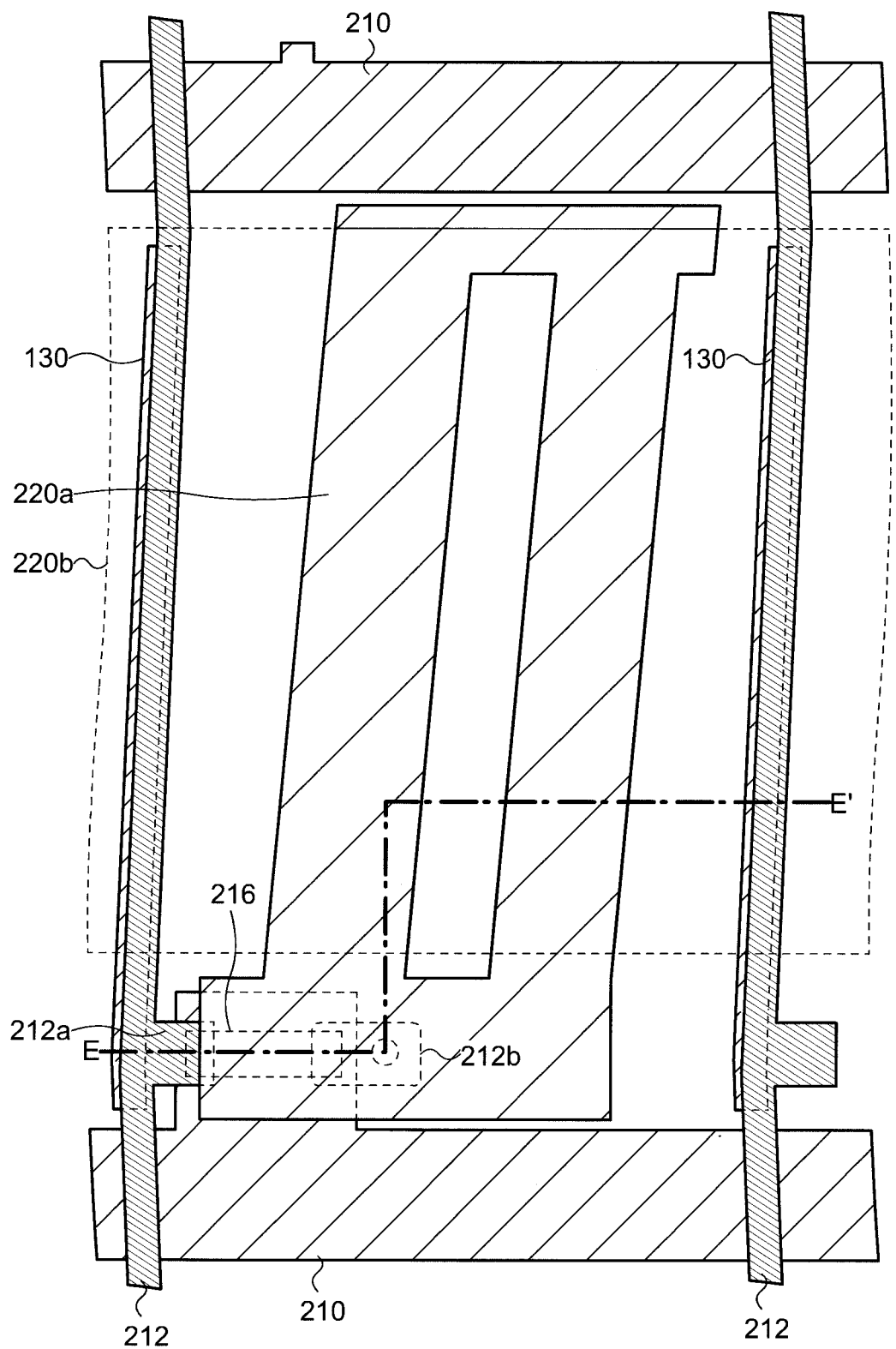
FIG. 11 is a schematic top view of a pixel of a display device according to an embodiment of the present invention.
Figure 12:
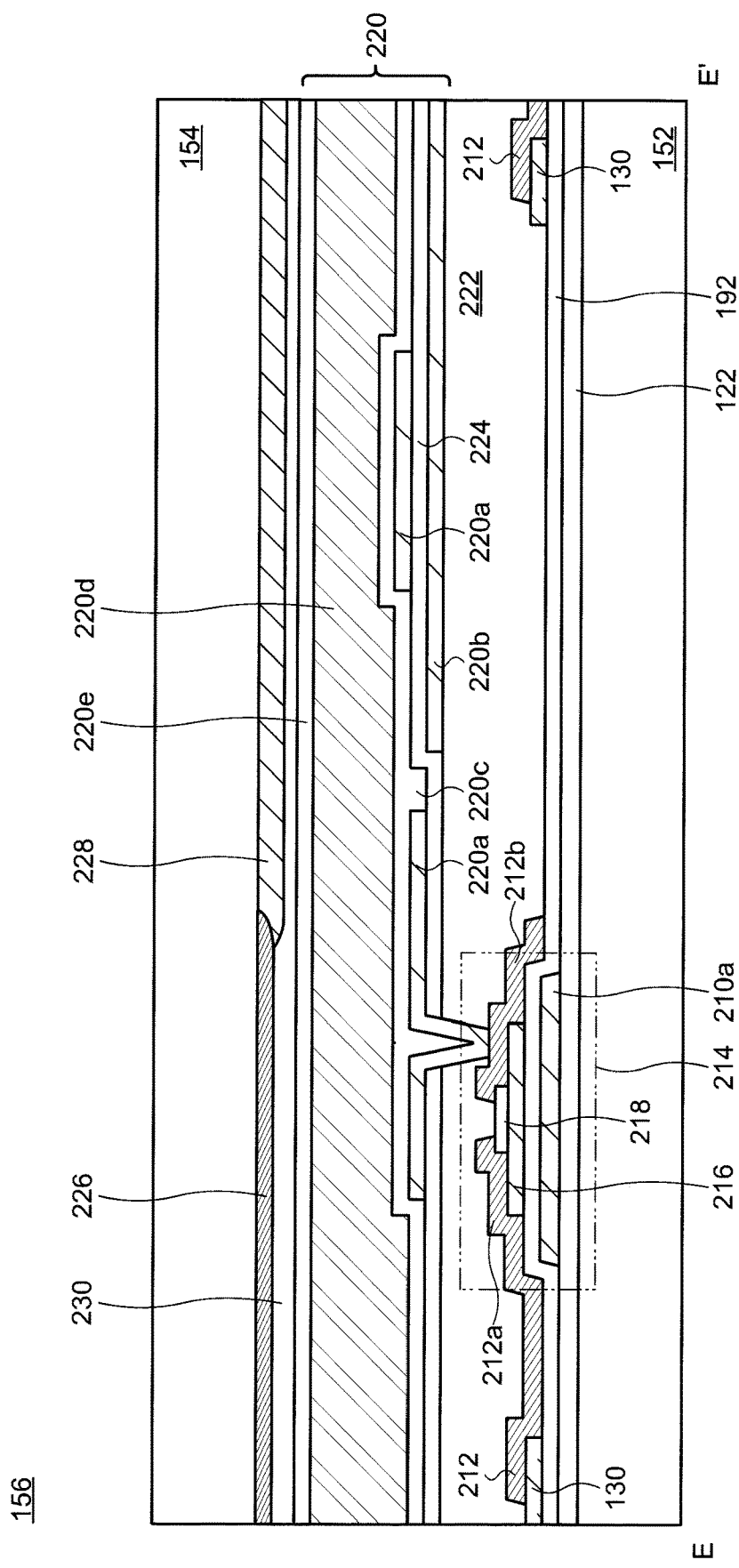
FIG. 12 is a schematic cross-sectional view of a pixel of a display device according to an embodiment of the present invention.

A schematic top view of the pixel 156 is shown in FIG. 11, and a schematic view of a cross section along a chain line E-E' in FIG. 11 is shown in FIG. 12 in the case of having a liquid crystal element as the display element. Although FIG. 11 and FIG. 12 demonstrate an example in which one transistor 214 is formed in one pixel 156, the structure of the pixel circuit in the pixel 156 may be arbitrarily determined. Thus, two or more transistors may be disposed in each pixel 156, and one or a plurality of elements (capacitor element or the like) other than a transistor may be provided.

Gate wirings 210 extending from the scanning-line driver circuits 160 and signal lines 212 extending from the driver IC 166 or the signal-line driver circuit are provided over the substrate 152, and each pixel 156 is connected to the gate wiring 210 and the signal wiring 212. The signal lines 212 are supplied with an initializing signal for initializing the transistor 214 and an image signal corresponding to the gradation data required to display an image. The gate wiring 210 and the signal line 212 respectively correspond to the gate wiring 110 and the first wiring 116 of the semiconductor device 100 of the First Embodiment.

The transistor 214 corresponds to the transistor 104 of the First Embodiment and is structured by a gate electrode 210a (a portion protruding upward from the gate wiring 210 in FIG. 11), a gate insulating film 192 covering the gate electrode 210a, and a semiconductor film 216 overlapping with the gate electrode 210a through the gate insulating film 192 as well as a first terminal 212a (a part of the signal line 212 protruding rightward from the signal line 212 in FIG. 11) and a second terminal 212b which are located over and electrically connected to the semiconductor film 216. The semiconductor film 216 contains an oxide semiconductor. The first terminal 212a and the second terminal 212b respectively correspond to the first terminal 116a and the second wiring 118 including the second terminal 118a of the transistor 104. The transistor 176 may include a channel-protection film 218.

A leveling film 222 is disposed over the transistor 214 to absorb depressions and projections caused by the transistor 214 and provide a flat surface, and a liquid crystal element 220 is arranged over the leveling film 222. The liquid crystal element 220 possesses, as a fundamental structure, a pixel electrode 220a, a common electrode 220b, a first orientation film 220c covering the pixel electrode 220a and the common electrode 220b, a liquid crystal layer 220d provided over the first orientation film 220c, and a second orientation film 220e located over the liquid crystal layer 220d and formed on the opposing substrate 154.

The common electrode 220b is formed so as to be shared by the plurality of pixels 156. For example, the common electrode 220b is arranged parallel to the gate wirings 210 so as to be shared by the plurality of pixels 156 connected to one gate wiring 210 as shown in FIG. 11. Although not illustrated, the common electrode 220b may be arranged parallel to the signal lines 212 so as to be shared by the plurality of pixels 156 connected to one signal line 212 or may be arranged so as to be shared by all of the pixels 156. Although not illustrated, a power-source line in contact with the common electrode 220b is arranged for the common electrode 220b. The common electrode 220b is supplied with a constant potential (e.g., a potential slightly lower than an intermediate potential between the maximum potential and the minimum potential supplied to the signal lines 212) by the power-source line.

The pixel electrode 220a is formed over the common electrode 220b through an insulating film 224. As depicted in FIG. 11, the pixel electrode 220a has a slit having a closed shape, and a part of the common electrode 220b is exposed from the slit. Although not illustrated, the pixel electrode 220a may have a cutoff instead of a slit. Alternatively, the pixel electrode 220a may simultaneously have a slit and a cutoff. Note that a slit is an opening formed in the pixel electrode 220a and having a closed shape, and an outer circumference thereof is an internal circumference of the pixel electrode 220a. When the outer circumference of this opening is a part of an outer circumference of the pixel electrode 220a, the opening is defined as a cutoff.

The pixel electrode 220a is electrically connected to the second terminal 212b through an opening formed in the leveling film 222 and the insulating film 224, by which the signal supplied to the signal line 212 is provided to the pixel electrode 220a through the first terminal 212a, the semiconductor film 216, and the second terminal 212b. The rotation of liquid crystal molecules included in the liquid crystal layer 220b is controlled with a potential difference between the pixel electrode 220a and the common electrode 220b, by which a polarizing axis of linearly polarized light incident from a backlight (not illustrated) through a polarizing plate is controlled. The linearly polarized light is extracted through a polarizing plate (not illustrated) disposed over the counter substrate 154. Transmissivity of the light from the backlight is determined by a rotation angle of the polarizing axis, thereby generating gradations.

A light-shielding film 226 and a color filter 228 are disposed on the counter substrate 154. The light passing through the liquid crystal layer 220d is colorized with the color filter 228, which allows the pixels 156 to provide color information. The light-shielding film 226 is configured to have low transmissivity with respect to visible light or not to substantially transmit visible light and is disposed to cover the transistor 214, the signal line 212, and the gate line 210. As an optional structure, an overcoat 230 covering the color filter 228 and the light-shielding film 226 may be provided on the counter substrate 154.

Although not illustrated, a spacer may be disposed in the liquid crystal layer 220d to maintain a gap between the substrate 152 and the counter substrate 154. Moreover, a touch sensor may be further provided to the counter substrate 154. The liquid crystal element with the aforementioned structure is a so-called FFS (Fringe Field Switching) liquid crystal element. However, the liquid crystal element may be an IPS (In-Plane Switching) liquid crystal element. In this case, the pixel 156 is configured so that the common electrode 220b also has a slit or cutoff and exists in the same layer as the pixel electrode 220a.

At least one of the first electron-trapping film 130 and the second electron-trapping film 132 is provided to each pixel 156. Since the first electron-trapping film 130 and the second electron-trapping film 132 are formed in the same process as the formation of the semiconductor film 216, the first electron-trapping film 130, the second electron-trapping film 132, and the semiconductor film 216 may have the same composition and thickness. The first electron-trapping film 130 and the second electron-trapping film 132 may be disposed so as to be respectively in contact with the signal line 212 and the second terminal 212b. In the case where one of the first electron-trapping film 130 and the second electron-trapping film 132 is provided, it is preferred to form the first electron-trapping film 130 in contact with the signal line 212 having a larger side-surface area than the second terminal 212b as shown in FIG. 11. As described in the First Embodiment, the formation of the first electron-trapping film 130 or the second electron-trapping film 132 suppresses the shift of the initial properties of the transistor 214 disposed in the pixel 156 and increases reliability of the circuit provided in each pixel 156, which also contributes to an increase in reliability of the display device 150.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display devices having electrophoretic elements and the like. In addition, it is apparent that the size of the display device is not limited, and the embodiment can be applied to display devices having any size from medium to large.

It is understood that another effect different from that provided by the modes of the aforementioned embodiments is achieved by the present invention if the effect is obvious from the description in the specification or readily conceived by persons ordinarily skilled in the art.

What is claimed is:

1. A semiconductor device comprising:
a gate wiring including a gate electrode;
an active layer overlapping with the gate electrode and containing an oxide semiconductor;
a gate insulating film sandwiched by the gate electrode and the active layer;
a first wiring and a second wiring each located over the active layer and respectively including a first terminal and a second terminal which are electrically connected to the active layer;
a first semiconductor film under and in contact with the first wiring; and
a second semiconductor film located under and in contact with the second wiring,
wherein
the second semiconductor film contains the oxide semiconductor, and
the first semiconductor film overlaps with the first wiring in a region which does not overlap with the gate electrode and the gate wiring and contains the oxide semiconductor.

2. The semiconductor device according to claim 1, wherein a first side surface of the first wiring overlaps with the first semiconductor film.

3. The semiconductor device according to claim 2, wherein a second side surface of the first wiring opposing the first side surface overlaps with the first semiconductor film.

4. The semiconductor device according to claim 2, wherein a side surface of the first semiconductor film overlaps with the first wiring.

5. The semiconductor device according to claim 1, wherein the active layer and the first semiconductor film exist in a same layer.

6. The semiconductor device according to claim 1, wherein the active layer and the second semiconductor film exist in a same layer.

7. The semiconductor device according to claim 1, wherein the active layer and the first semiconductor film are spaced away from each other.

8. The semiconductor device according to claim 7, wherein the first semiconductor film overlaps with a portion of the first wiring other than the first terminal.

9. The semiconductor device according to claim 1, wherein the first semiconductor film includes:
a first region covered by the first wiring; and
a second region exposed from the first wiring and having a larger area than the first region.

10. A display device comprising:
a pixel;
a gate wiring including a gate electrode;
a first wiring intersecting the gate wiring and including a first terminal; and
a second wiring including a second terminal located over and electrically connected to the active layer,
wherein the pixel comprises:
a transistor comprising the gate electrode, an active layer overlapping with the gate electrode and containing an oxide semiconductor, a gate insulating film sandwiched by the gate electrode and the active layer, and the first terminal located over and electrically connected to the active layer;
a display element electrically connected to the transistor;
a first semiconductor film under and in contact with the first wiring, the first semiconductor film overlapping with the first wiring in a region which does not overlap with the gate electrode or the gate wiring and containing the oxide semiconductor, and
a second semiconductor film under and in contact with the second wiring, the second semiconductor film containing the oxide semiconductor.

11. The display device according to claim 10, wherein a first side surface of the first wiring overlaps with the first semiconductor film.

12. The display device according to claim 11, wherein a second side surface of the first wiring opposing the first side surface overlaps with the first semiconductor film.

13. The display device according to claim 11, wherein a side surface of the first semiconductor film overlaps with the first wiring.

14. The display device according to claim 10, wherein the active layer and the first semiconductor film exist in a same layer.

15. The display device according to claim 10, wherein the active layer and the second semiconductor film exist in a same layer.

16. The display device according to claim 10, wherein the active layer and the first semiconductor film are spaced away from each other.

17. The display device according to claim 16, wherein the first semiconductor film overlaps with a portion of the first wiring other than the first terminal.

18. The display device according to claim 10, wherein the first semiconductor film includes:
a first region covered by the first wiring; and
a second region exposed from the first wiring and having a larger area than the first region.

* * * * *